(12) United States Patent
Ebata et al.

(10) Patent No.: US 12,218,272 B2
(45) Date of Patent: Feb. 4, 2025

(54) SEMICONDUCTOR DEVICE

(71) Applicant: Nippon Telegraph and Telephone Corporation, Tokyo (JP)

(72) Inventors: Kazuaki Ebata, Tokyo (JP); Yoshitaka Taniyasu, Tokyo (JP); Kazuhide Kumakura, Tokyo (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 767 days.

(21) Appl. No.: 17/422,913

(22) PCT Filed: Feb. 10, 2020

(86) PCT No.: PCT/JP2020/005085
§ 371 (c)(1),
(2) Date: Jul. 14, 2021

(87) PCT Pub. No.: WO2020/175125
PCT Pub. Date: Sep. 3, 2020

(65) Prior Publication Data
US 2022/0059723 A1    Feb. 24, 2022

(30) Foreign Application Priority Data
Feb. 25, 2019    (JP) .................... 2019-031415

(51) Int. Cl.
*H01L 33/16*    (2010.01)
*H01L 33/00*    (2010.01)
(Continued)

(52) U.S. Cl.
CPC .......... *H01L 33/16* (2013.01); *H01L 33/0025* (2013.01); *H01L 33/007* (2013.01);
(Continued)

(58) Field of Classification Search
CPC ... H01L 33/16; H01L 33/0025; H01L 33/007; H01L 33/32; H01S 5/34333; H01S 5/3063; H01S 5/3425
See application file for complete search history.

(56) References Cited

U.S. PATENT DOCUMENTS

2006/0273329 A1    12/2006  Ohta et al.
2009/0166608 A1*    7/2009  Nakanishi ............... H01L 33/22
                                                    257/E33.068
2012/0033444 A1    2/2012   Moon et al.

FOREIGN PATENT DOCUMENTS

JP    3631157 B2    3/2005
JP    2006344689 A  12/2006

OTHER PUBLICATIONS

Ebata et al., "High Hole Concentration in Mg-doped AlN/AlGaN Superlattices with High Al Content," Japanese Journal of Applied Physics, vol. 57, No. 4S, Mar. 2018, 3 pages.
(Continued)

*Primary Examiner* — Peniel M Gumedzoe
(74) *Attorney, Agent, or Firm* — SLATER MATSIL, LLP

(57) ABSTRACT

A p-type semiconductor layer includes a plurality of unit semiconductor layers, and each of the plurality of unit semiconductor layers includes a p-type nitride semiconductor whose main surface is a polar surface or a semi-polar surface. The nitride semiconductor constituting the unit semiconductor layer includes nitrogen and two or more elements, and each of the plurality of unit semiconductor layers has a composition changing in a stacking direction such that, for example, a lattice constant in a c-axis direction increases in a c-axis positive direction.

10 Claims, 5 Drawing Sheets

(51) Int. Cl.
  *H01S 5/343* (2006.01)
  *H01L 33/32* (2010.01)
  *H01S 5/30* (2006.01)
  *H01S 5/34* (2006.01)

(52) U.S. Cl.
  CPC .......... *H01S 5/34333* (2013.01); *H01L 33/32* (2013.01); *H01S 5/3063* (2013.01); *H01S 5/3425* (2013.01)

(56) References Cited

OTHER PUBLICATIONS

Amano et al., "Growth and conductivity control of high quality AlGaN and its application to high-performance ultraviolet laser diodes," Proceedings of SPIE, vol. 7216, 2009, pp. 72161-72161.

Ebata et al., "Increase in emission intensity of UV LED using p-type graded AlGaN superlattices Increase in emission Intensity of UV LED using p-type graded AlGaN superlattices," Proceedings of the 79th JSAPAutumn Meeting, Sep. 18, 2018. 1 page.

Ebata et al. "p-type graded AlGaN superlattices for deep-ultraviolet light-emitting diodes," International Workshop on NitrideSemiconductors, Nov. 11, 2018, 1 page.

Jiang et al., "Hexagonal boron nitride for deep ultraviolet photonic devices," Semiconductor Science and Technology, 29, 2014, pp. 1-14.

Simon et al., "Polarization-Induced Hole Doping in Wide-Band-Gap Uniaxial Semiconductor Heterostructures," Science, vol. 327, Jan. 2010, pp. 60-64.

\* cited by examiner

SEMICONDUCTOR DEVICE

CROSS-REFERENCE TO RELATED APPLICATIONS

This application is a national phase entry of PCT Application No. PCT/JP2020/005085, filed on Feb. 10, 2020, which claims priority to Japanese Application No. 2019-031415, filed on Feb. 25, 2019, which applications are hereby incorporated herein by reference.

TECHNICAL FIELD

The present disclosure relates to a semiconductor apparatus including a nitride semiconductor.

BACKGROUND

Nitride semiconductors represented by AlN, GaN, InN, and mixed crystals of AlN, GaN, and InN have a large band gap energy and are direct transition type semiconductor materials. Thus, nitride semiconductors have attracted attention as materials constituting semiconductor light emitting devices such as light emitting diodes (LEDs) and semiconductor lasers (LDs) that can cover a wide light emission wavelength range from ultraviolet to red.

In recent years, by shortening the light emission wavelength, light emitting devices using nitride semiconductors is expected to be applied in a wide range of fields such as sterilization, water purification, various medical fields, and high speed degradation treatment of pollutants. For example, research and development of semiconductor light emitting devices that emit light in a deep ultraviolet region (wavelength: 200 nm to 350 nm) is being carried out vigorously at each research institute. In this type of light emitting device, a p-type layer and an n-type layer are used for injecting current into the light emitting layer. However, because the acceptor level of the p-type nitride semiconductor is deep, it is difficult to produce a low resistance p-type semiconductor layer having a high hole concentration at room temperature (Non Patent Literatures 1 and 2). Thus, the reduction in resistance of the p-type nitride semiconductor, especially, the achievement of the low resistance p-type layer in the AlGaN system having a large band gap, greatly contributes to the development of ultraviolet light emitting devices.

Examples of techniques for achieving high hole concentration in p-type for low resistance of a p-type nitride semiconductor include $Al_xGa_{1-x}N/Al_yGa_{1-y}N$ ($x \neq y$) superlattice structures doped with acceptor impurities (Patent Literature 1). In this technique, a polarization field generated in the superlattice is utilized to obtain a high concentration of holes. However, in the superlattice structure described above, there is a problem in which the AlGaN barrier layer inhibits the injection of holes from the p-type layer to the active layer and reduces the light emission efficiency of the light emitting device. As a technique for achieving other high hole concentrations, a p-type layer including AlGaN with an inclined Al composition has been proposed (Non Patent Literature 3). In this technique, the hole concentration of the p-type layer including p-type AlGaN is inversely proportional to the layer thickness of the p-type layer, and thus there is a problem in which the hole concentration decreases as the layer thickness of the p-type layer increases.

CITATION LIST

Patent Literature

Patent Literature 1: JP 3631157 B

NON PATENT LITERATURE

Non Patent Literature 1: H, Amano et al., "Growth and conductivity control of high quality AlGaN and its application to high-performance ultraviolet laser diodes", Proc. SPIE, Vol. 7216, 72161B, 2009.

Non Patent Literature 2: H X Jiang and J Y Lin, "Hexagonal boron nitride for deep ultraviolet photonic devices", Semiconductor Science and Technology, vol. 29, 084003, 2014.

Non Patent Literature 3: J. Simon et al., "Polarization-Induced Hole Doping in Wide. Band-Gap Uniaxial Semiconductor Heterostructures", Science, vol. 327, 5961, pp. 60-64, 2010.

SUMMARY

Technical Problem

As described above, when a p-type layer comprising a nitride semiconductor such as AlGaN is applied to a light emitting device, the hole injection efficiency is low, which leads to a problem of lowering the light emission efficiency.

The present disclosure has been made to solve the above problems, and an object is to provide a low resistance p-type semiconductor layer having a high hole concentration of a nitride semiconductor.

Means for Solving the Problem

A semiconductor apparatus according to the present disclosure includes a p-type semiconductor layer formed on a substrate, in which the p-type semiconductor layer includes a plurality of unit semiconductor layers, each of the plurality of unit semiconductor layers includes a p-type nitride semiconductor whose main surface is a polar surface or a semi-polar surface, the nitride semiconductor includes nitrogen and two or more elements, and each of the plurality of unit semiconductor layers has a composition changing in a stacking direction.

In one configuration example of the semiconductor apparatus described above, each of the plurality of unit semiconductor layers changes such that a lattice constant in a c-axis direction increases in a c-axis positive direction.

In one configuration example of the semiconductor apparatus described above, each of the plurality of unit semiconductor layers has a composition varying continuously.

In one configuration example of the semiconductor apparatus described above, each of the plurality of unit semiconductor layers is transformed to be p-type by introducing impurities.

In one configuration example of the semiconductor apparatus described above, the unit semiconductor layer includes AlGaN, and a composition ratio of Al to Ga changes in the stacking direction.

In one configuration example of the semiconductor apparatus described above, a light emitting layer and an n-type semiconductor layer are further provided on the substrate.

Effects of embodiments of the Invention

As described above, according to the present disclosure, a p-type semiconductor layer including a nitride semiconductor can be provided with a low resistance and a high hole concentration.

BREIF DESCRIPTION OF THE DRAWINGS

DETAILED DESCRIPTION OF ILLUSTRATIVE EMBODIMENTS

Figure 1:
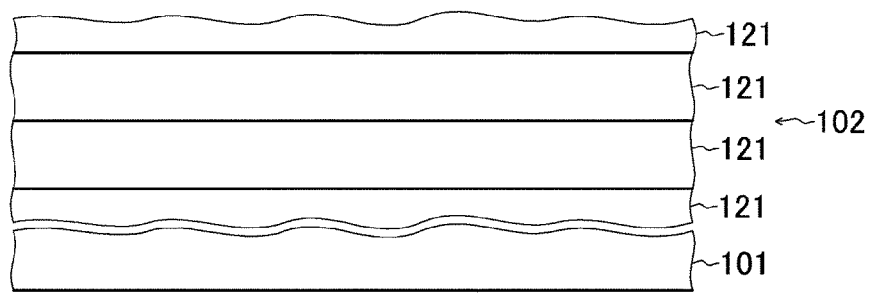
FIG. 1 is a cross-sectional view illustrating a partial configuration of a semiconductor apparatus according to an embodiment of the present disclosure.

Hereinafter, a semiconductor apparatus according to an embodiment of the present disclosure will be described with reference to FIG. 1. The semiconductor apparatus includes a p-type semiconductor layer 102 formed on a substrate 101. The p-type semiconductor layer 102 includes a plurality of unit semiconductor layers 121, and each of the plurality of unit semiconductor layers 121 includes a p-type nitride semiconductor whose main surface is a polar surface or a semi-polar surface. The substrate 101 includes, for example, SiC. For example, a p-type semiconductor layer 102 including a plurality of unit semiconductor layers 121 having a main surface as a polar surface can be formed by crystal growth of the nitride semiconductor in the c-axis direction.

The nitride semiconductor constituting the unit semiconductor layer 121 includes nitrogen and two or more elements, and each of the plurality of unit semiconductor layers 121 has a composition changing in a stacking direction. For example, when each of the plurality of unit semiconductor layers 121 is formed by crystal growth in the c-axis direction, the lattice constant changes so as to increase in the c-axis positive direction. Note that when each of the plurality of unit semiconductor layers 121 has a thickness in a range where the lattice does not relax, the lattice constant parallel to the plane of the substrate 101 is substantially the same.

The unit semiconductor layer 121 includes AlGaN, for example, and the composition ratio of Al to Ga changes in the stacking direction. Further, for example, each of the plurality of unit semiconductor layers 121 has a composition varying continuously (for example, linearly) in the stacking direction. Each of the plurality of unit semiconductor layers 121 can have a configuration in which the composition changes stepwise in the stacking direction. Further, each of the plurality of unit semiconductor layers 121 is a p-type in which impurities are introduced. In addition, the layered structure of the plurality of unit semiconductor layers 121 in which the respective compositions change in the thickness direction may be referred to as a superlattice structure.

The semiconductor apparatus of the embodiment is a light emitting device that further includes, for example, a light emitting layer and an n-type semiconductor layer, in addition to the p-type semiconductor layer 102, on the substrate 101. For example, the light emitting diode (LED) can be configured by sandwiching the light emitting layer between the p-type semiconductor layer 102 and the n-type semiconductor layer. Further, a semiconductor laser can be formed by combining a resonator in a configuration in which the light emitting layer is sandwiched between the p-type semiconductor layer 102 and the n-type semiconductor layer.

According to the embodiment, the hole concentration in the p-type semiconductor layer 102 can be made higher. This will be described below. In the following, by using as an example, a case in which the p-type semiconductor layer 102 includes AlGaN crystal grown on a substrate with a surface orientation of the main surface as the (0001) surface, the improvement of the hole concentration will be described with reference to FIG. 2.

Figure 2:
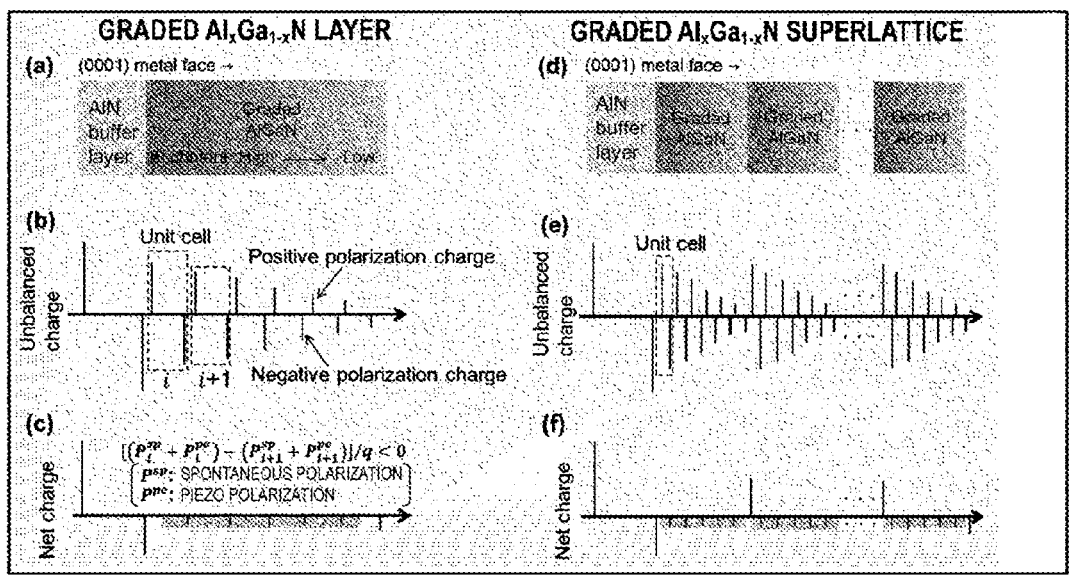
FIG. 2 is an explanatory diagram illustrating an improvement in a hole concentration in a p-type semiconductor layer of the present disclosure.

FIG. 2($a$) illustrates a p-type semiconductor layer formed by one graded composition layer including AlGaN whose Al composition has been varied so as to be reduced from left to right (in the c-axis positive direction). FIG. 2($b$) illustrates a change in polarization charge in the layer thickness direction of the p-type semiconductor layer illustrated in FIG. 2($a$). FIG. 2($c$) illustrates a polarization charge state of the entire layer of the p-type semiconductor layer illustrated in FIG. 2($a$).

FIG. 2($d$) illustrates a p-type semiconductor layer including a plurality of graded composition layers. Each graded composition layer includes AlGaN that has been varied to reduce the composition of Al from left to right (in the c-axis positive direction). In addition, the amount of change in the Al composition of each graded composition layer is the same as the amount of change in the Al composition of the p-type semiconductor layer illustrated in FIG. 2($a$). FIG. 2($e$) illustrates a change in polarization charge in the layer thickness direction of the p-type semiconductor layer illustrated in FIG. 2($d$). FIG. 2($f$) illustrates a polarization charge state of the entire layer of the p-type semiconductor layer illustrated in FIG. 2($d$).

In a graded composition layer of $Al_xGa_{1-x}N$ in which the composition ratio of Al and Ga is varied in the c-axis direction, positive and negative polarization charges are generated in each of units adjacent in the c-axis direction. The unit is a portion of a constant composition ratio in the c-axis direction. The p-type semiconductor layer illustrated in FIG. 2($a$) and the graded composition layer of the p-type semiconductor layer illustrated in FIG. 2($d$), have the same amount of change in the Al composition.

As illustrated in FIGS. 2($b$) and 2($e$), the effective polarization charges at the interface between the i-th unit and the (i+1)-th unit, which are adjacent to each other, can be expressed by an equation $[(P^{sp}_i+P^{pe}_i)-(P^{sp}_{i+1}+P^{pe}_{i+1})]/q<0$. Note that $P^{sp}$ indicates spontaneous polarization, $P^{pe}$ indicates piezo polarization, and q indicates an elementary charge. The effective polarization charge at the interface between the i-th unit and the (i+1)-th unit portion is negative.

As described above, in the p-type semiconductor layer illustrated in FIG. 2(a), negative polarization charges are generated as illustrated in FIG. 2(c). On the other hand, in the p-type semiconductor layer including the plurality of graded composition layers illustrated in FIG. 2(d), the same negative polarization charges as the p-type semiconductor layer illustrated in FIG. 2(a) are generated in each graded composition layer. Thus, the p-type semiconductor layer including the plurality of graded composition layers illustrated in FIG. 2(d) can increase the negative polarization charges as compared to the p-type semiconductor layer illustrated in FIG. 2(a).

It can be seen that configuring the p-type semiconductor layer 102 from the plurality of unit semiconductor layers 121 including the p-type nitride semiconductor whose main surface is a polar surface or a semi-polar surface in this manner is effective as a technique for increasing the negative polarization charge. Because the acceptor impurities in the nitride semiconductor are ionized and holes are induced in a negative polarization charge region to become a p type, an increase in negative polarization charges leads to an increase in hole concentration.

Note that it is preferable that each unit semiconductor layer 121 is transformed to be p-type by doping acceptor impurities. Although Mg is generally used as the acceptor impurity, the present disclosure is not limited to Mg, and Zn, Be, Ca, Sr, Ba, or the like can be applied as acceptor impurities. The concentration of acceptor impurities in each of the unit semiconductor layers 121 is preferably from $2 \times 10^{16}$ cm$^{-3}$ to $2 \times 10^{20}$ cm$^{-3}$. When the concentration of acceptor impurities in each of the unit semiconductor layers 121 is less than $2 \times 10^{16}$ cm$^{-3}$, the hole concentration decreases, and for example, there is a risk that the hole injection efficiency of the p-type semiconductor layer 102 decreases when used for the light emitting device.

In addition, when the concentration of acceptor impurities in each of the unit semiconductor layers 121 exceeds $2 \times 10^{20}$ cm$^{-3}$, the hole concentration decreases greatly due to the so-called self-compensation effect, and there is a risk that the p-type semiconductor layer 102 will be highly resistant. The concentration of acceptor impurities in each of the unit semiconductor layers 121 can be checked by secondary ion mass spectrometry (SIMs).

Further, even when the acceptor impurities are not doped in each of the unit semiconductor layers 121, the unit semiconductor layer 121 may be a p type as long as each unit semiconductor layer 121 has a defect of acceptance or the like because of the presence of a hole supply source. In addition, even when the acceptor impurities are not doped in each of the unit semiconductor layers 121, the p-type semiconductor layer 102 may be a p type as long as the layer of the p-type nitride semiconductor is disposed in contact with the p-type semiconductor layer 102 because the hole supply source is present.

Incidentally, as illustrated in FIG. 2(f), in the p-type semiconductor layer illustrated in FIG. 2(d), positive polarization charges are generated at the interface between adjacent graded composition layers, and thus there is a risk that the hole distribution becomes discontinuous at this interface and may be depleted. As a technique for compensating for depletion at the interface of adjacent graded composition layers, delta doping of acceptor impurities is contemplated. For example, by performing delta doping of Mg as an acceptor impurity on the interface of the adjacent unit semiconductor layers 121, the barrier of the valence band at the interface can be reduced.

Further, the unit semiconductor layer 121 preferably has a single crystal structure in all regions, but the polycrystalline or amorphous regions may be partially unevenly distributed to an extent which various properties of the crystalline nitride semiconductor are not lost. The layer thickness of each of the plurality of unit semiconductor layers 121 is preferably 2% to 50% with respect to the layer thickness of the p-type semiconductor layer 102.

When the layer thickness of each of the plurality of unit semiconductor layers 121 is less than 2% with respect to the layer thickness of the p-type semiconductor layer 102, the number of potential barriers at the interface of adjacent unit semiconductor layers 121 increases, and thus there is a risk that the hole injection efficiency may decrease when the p-type semiconductor layer 102 is applied to the light emitting device. Further, when the layer thickness of each of the plurality of unit semiconductor layers 121 exceeds 50% with respect to the layer thickness of the p-type semiconductor layer 102, there is a risk that the hole concentration may decrease and the resistance may be increased. Further, more preferably, the layer thickness of each of the plurality of unit semiconductor layers 121 is 5% to 40% with respect to the layer thickness of the p-type semiconductor layer 102.

Further, all of the plurality of unit semiconductor layers 121 need not have the same layer thickness. A portion of the plurality of unit semiconductor layers 121 included in the p-type semiconductor layer 102 may have a different layer thickness than others. For example, a p-type semiconductor layer 102 with a layer thickness of 300 nm may include 10 unit semiconductor layer 121 each having a layer thickness of 20 nm and two unit semiconductor layers 121 each having a layer thickness of 50 nm.

The cross-sectional structure of the p-type semiconductor layer 102 including the plurality of unit semiconductor layers 121 is clearly checked in a high-angle annular dark-field (HAADF) image. Note that the HAADF image is a mapping image of the integral intensity of electrons inelastically scattered at high angles, obtained by scanning transmission electron microscope (STEM). In the HAADF image, the image intensity is proportional to the square of the atomic number, and the place where an atom having a larger atomic number is present is observed brighter (white).

The element distribution of the p-type semiconductor layer 102 including the plurality of unit semiconductor layers 121 is specified by elemental analysis using an energy dispersive X-ray spectroscopy (EDS). EDS measurement is performed by an EDS measurement apparatus attached to the STEM apparatus. Other elemental analysis methods include SIMS.

The p-type semiconductor layer 102 (unit semiconductor layer 121) according to the embodiment can be formed by various epitaxial growth methods, for example. The epitaxial growth method preferably employs a metal organic vapor phase epitaxy (MOVPE) method, for example. The epitaxial growth method is not limited to the MOVPE method, and may be, for example, a hydride vapor phase epitaxy (HVPE) method, a molecular beam epitaxy (MBE) method, a sputtering method, or the like.

The p-type semiconductor layer 102 is manufactured by preparing a substrate 101, introducing (transporting) the substrate 101 into a film deposition chamber of an epitaxial growth apparatus, and stacking the unit semiconductor layer 121 by an epitaxial growth method. When a MOVPE apparatus is used as the epitaxial growth apparatus and the unit semiconductor layer 121 is produced to include AlGaN, trimethylaluminum (TMAl) is preferably used as the raw material gas of Al. Further, trimethylgallium (TMGa) is preferably used as the raw material gas of Ga. NH$_3$ is preferably employed as the raw material gas of N. Further, as the raw material gas of Mg, which is an impurity contributing to p-type conductivity, it is preferable to employ biscyclopentadienyl magnesium (Cp$_2$Mg). Further, for example, H$_2$ gas, N$_2$ gas, and a mixed gas of H$_2$ gas and N$_2$ gas are preferably employed as the carrier gas. Further, the raw material gas is not particularly limited, and for example, triethylgallium (TEGa) may be employed as the raw material gas of Ga, and hydrazine derivative or the like may be employed as the raw material gas of N.

As described above, the plurality of unit semiconductor layers 121 are stacked, and then are heated to activate p-type impurities. As the heating apparatus for heating, for example, a lamp heating device, an electric furnace, or the like can be employed. The p-type impurities refer to acceptor impurities, for example, Mg.

In the example described above, as the unit semiconductor layer 121, Al$_x$Ga$_{1-x}$N is crystal grown on the substrate 101 with the main surface as the (0001) surface, but the present disclosure is not limited to this. For example, the p-type semiconductor layer 102 including a plurality of unit semiconductor layers 121 can be formed even by crystal growth of Al$_x$Ga$_{1-x}$N on the substrate 101 with the main surface as the (000-1) surface. In this case, the plurality of unit semiconductor layers 121 are crystal grown in the c-axis negative direction, and negative polarization charges are induced and holes are generated, by increasing the Al composition x relative to the crystal growth direction. Further, the p-type semiconductor layer 102 including a plurality of unit semiconductor layers 121 can be formed by crystal growth of Al$_x$Ga$_{1-x}$N on the substrate 101 with the main surface as the (1-102) surface.

The material included in the substrate 101 is not limited to SiC, and may be other materials such as sapphire, GaN, AlN, MgAl$_2$O$_4$, SiO$_2$, MgO, ZnO, NdGaO$_3$, ScAlMgO$_4$, ZnS, GaAsSi, and the like. Further, the material included in the unit semiconductor layer 121 is not limited to Al$_x$Ga$_{1-x}$N, and can may be In$_x$Ga$_{1-x}$N, In$_x$Al$_{1-x}$N, In$_x$Al$_y$Ga$_{1-x-y}$N, or combinations of these.

The hole concentration of the p-type semiconductor layer 102 can be measured by a Hall effect measurement method. As in the details described below, when the hole concentration of the p-type semiconductor layer 102 is $1\times10^{17}$ cm$^{-3}$ or more and the activation energy of the hole concentration is 150 meV or less, good light-emitting characteristics are easily obtained at the application of the p-type semiconductor layer 102 to the light emitting device. The activation energy is measured by changing the temperature in the Hall effect measurement of the p-type semiconductor layer 102, and is obtained based on the slope when the logarithm of the carrier concentration is plotted (Arrhenius plot) with respect to the reciprocal of the temperature.

The p-type semiconductor layer 102 (unit semiconductor layer 121) according to the embodiment has a high hole concentration of not less than $10^{17}$ cm$^{-3}$ even in a high Al composition (x>0.7), and therefore can also be suitably applied in deep ultraviolet LEDs and deep ultraviolet LDs having a light emission wavelength of 300 nm or less.

Hereinafter, more details will be described using examples.

EXAMPLE 1

First, Example 1 will be described. In Example 1, a buffer layer was formed by first growing AlN by a MOVPE method on a substrate 101 including semi-insulating 4H-SiC and having a surface orientation of the main surface as (0001), and a plurality of unit semiconductor layers 121 were stacked on the buffer layer to form a p-type semiconductor layer 102. The unit semiconductor layer 121 included Mg-doped Al$_x$Ga$_{1-x}$N and is 20 nm thick. With respect to each of the plurality of unit semiconductor layers 121, the Al composition x was decreased from 0.9 to 0.7 relative to the crystal growth direction. Further, the p-type semiconductor layer 102 included the 10 unit semiconductor layers 121.

Figure 3:
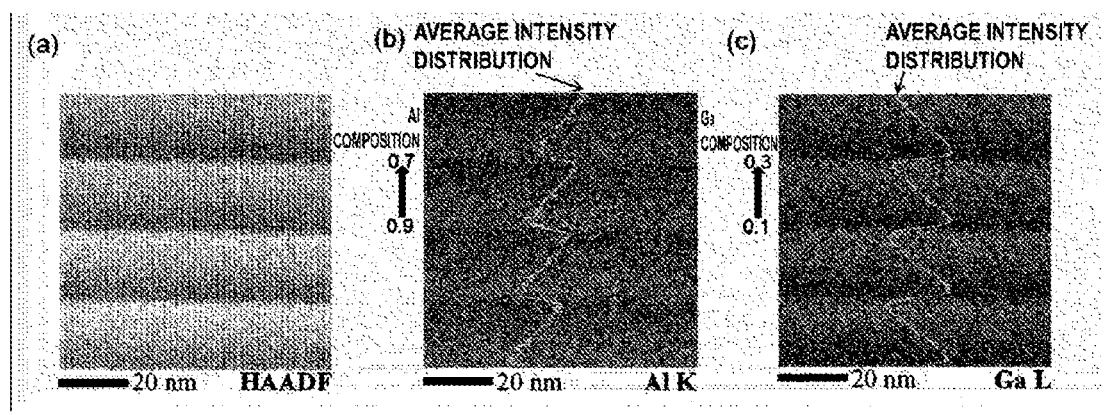
FIG. 3 is a characteristic diagram illustrating a HAADF-STEM image (a), an EDS mapping image (b) of an Al composition, and an EDS mapping image (c) of a Ga composition of a p-type semiconductor layer 102 in Example 1.

FIG. 3 illustrates (a) a HAADF-STEM image, (b) an EDS mapping images of an Al composition, and (c) an EDS mapping image of a Ga composition, of the p-type semiconductor layer 102 in Example 1 described above. For this measurement, JEM-ARM200F (manufactured by JEOL Ltd.) was used, and the accelerating voltage in the measurement was 200 kV. By measuring SIMS using ADEPT$_{1010}$ (manufactured by ULVAC PHI, INCORPORATED), it was found that the doping amount of Mg in the unit semiconductor layer 121 was $2\times10^{19}$ cm$^{-3}$. Further, it was checked that the Al composition x has changed from 0.9 to 0.7 in the unit semiconductor layer 121, in the measurement by using the same SIMS.

Note that as illustrated in the HAADF-STEM image of FIG. 3($a$), it was checked that the interface of adjacent unit semiconductor layers 121 was steep, and that a unit semiconductor layer 121 with a layer thickness of 20 nm was produced. Further, from the EDS mapping images of FIGS. 3($b$) and 3($c$), it was checked that the unit semiconductor layer 121 was repeatedly stacked, in a state where the Al and Ga compositions changed linearly relative to the crystal growth direction. Note that the average Al composition in one unit semiconductor layer 121 was x=0.8.

Example 2

Next, Example 2 is described. In Example 2, similar to Example 1 described above, a buffer layer was formed by first growing AlN by a MOVPE method on a substrate 101 including semi-insulating 4H-SiC and having a surface orientation of the main surface as (0001), and a plurality of unit semiconductor layers 121 were stacked on the buffer layer to form a p-type semiconductor layer 102 with a thickness of 200 nm.

In Example 2, five types of samples described below were produced. Sample 1 was a p-type semiconductor layer 102 formed by stacking 40 layers of unit semiconductor layer 121 with a thickness of 5 nm. Sample 2 was a p-type semiconductor layer 102 formed by stacking 20 layers of unit semiconductor layer 121 with a thickness of 10 nm. Sample 3 was a p-type semiconductor layer 102 formed by stacking ten layers of unit semiconductor layer 121 with a thickness of 20 nm. Sample 4 was a p-type semiconductor layer 102 formed by stacking four layers of unit semiconductor layer 121 with a thickness of 50 nm. Sample 5 was a p-type semiconductor layer 102 formed by stacking two layers of unit semiconductor layer 121 with a thickness of 100 nm. With respect to any sample, in one unit semiconductor layer 121, the Al composition x of Al$_x$Ga$_{1-x}$N was decreased from 0.9 to 0.7 relative to the crystal growth direction. In any sample, the doping amount of Mg was $2\times10^{19}$ cm$^{-3}$. After each sample was produced, the sample was heated at 800° C. for 10 minutes with N$_2$ flow using a lamp heating device to activate the sample.

Further, as a comparative example, Comparative Sample 1 was produced by a p-type semiconductor layer having a layer thickness of 200 nm, including a p-type Al$_x$Ga$_{1-x}$N doped with Mg. In Comparative Sample 1, the Al composition x of $Al_xGa_{1-x}N$ was decreased from 0.9 to 0.7 relative to the crystal growth direction of the p-type semiconductor layer. The Comparative Sample 1 was a sample in which a p-type semiconductor layer 102 included a single layer of the unit semiconductor layer 121 having a thickness of 200 nm. Further, as a comparative example, Comparative Sample 2 was produced by a p-type semiconductor layer having a layer thickness of 200 nm, including a p-type $Al_{0.8}Ga_{0.2}N$ doped with Mg. Comparative Sample 2 had no change in composition in the thickness direction. In any comparative sample, the doping amount of Mg was $2 \times 10^{19}$ $cm^{-3}$. After each comparative sample was produced, the comparative sample was heated at 800° C. for 10 minutes with $N_2$ flow using a lamp heating device to activate the comparative sample.

In Example 2, the hole concentrations of the p-type semiconductor layer 102 in Samples 1 to 5 and the p-type semiconductor layer in the Comparative Samples 1 and 2 were measured. The hole concentration can be measured using the "van der Pauw" method. Examples of the Hall effect measurement apparatus and the measurement conditions will be described below.

Hall effect measurement apparatus: "Resi Test 8300" manufactured by Toyo Corporation.

Measurement conditions: room temperature (approximately 25° C.), approximately 0.25 [T], approximately $10^{-4}$ to $10^{-9}$ [A], and AC magnetic field Hall measurements.

The sample shape was a plate shape of approximately 5 mm×5 mm in plan view.

Figure 4:
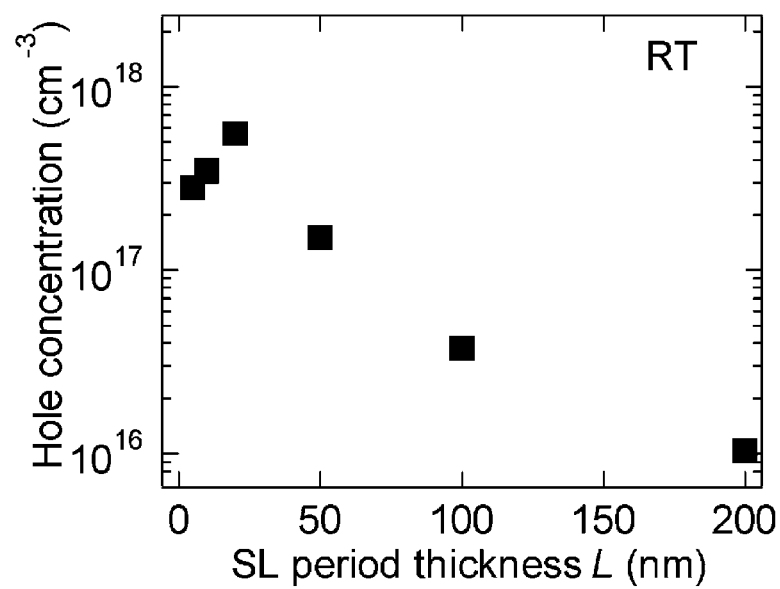
FIG. 4 is a characteristic diagram illustrating measurement results of a hole concentration of each sample in Example 2.

The measurement results of the hole concentration described above are illustrated in FIG. 4. As illustrated in FIG. 4, it can be seen that the hole concentration was higher as the thickness of the unit semiconductor layer 121 becomes smaller unless the thickness became 20 nm or smaller. By setting the thickness of the unit semiconductor layer 121 to be 50 nm or less, a hole concentration of $10^{17}$ $cm^{-3}$ or greater was obtained (Samples 1 to 4). This resulted in an increase in the hole concentration by single-digit or more as compared to Comparative Sample 1. The p-type semiconductor layer 102 was configured from the plurality of unit semiconductor layers 121 in addition to polarization doping, so that a large number of negative polarization charges were induced in each of the unit semiconductor layers 121, thereby increasing the hole concentration. Because the resistivity of the Comparative Sample 2 was as high as $9.6 \times 10^4$ Ω cm, the hole concentration could not be measured using the Hall effect measurement. As described in Non Patent Literatures 1 and 2, the hole concentration of the Comparative Sample 2 is considered to be $10^{14}$ $cm^{-3}$ or less.

Further, the temperature dependence of the hole concentration was measured by changing the temperature from room temperature to 500 K for Sample 2 and Comparative Sample 1. The slope (activation energy=Ea) was obtained by taking the reciprocal of temperature on the horizontal axis and the logarithm of hole concentration on the vertical axis, according to the equation $p=n_o \exp(-Ea/kT)$. Here, "T" indicates temperature, "p" indicates the hole concentration at temperature T, "$n_o$" indicates a constant, "Ea" indicates activation energy, and "k" indicates a Boltzmann's constant. As a result, sample 2 had activation energy of 52 meV. On the other hand, it was found that Comparative Sample 1 had the activation energy of 171 meV, which was higher than the activation energy of Sample 2, and had the temperature dependence higher than that of Sample 2.

EXAMPLE 3

Figure 5:
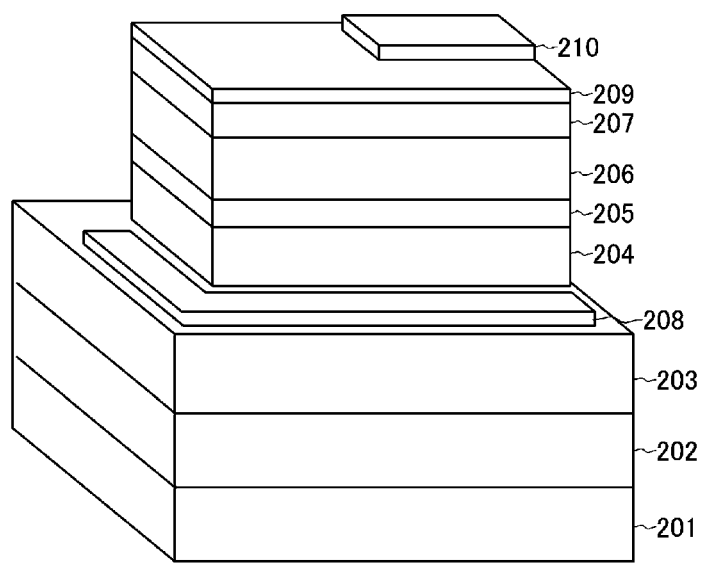
FIG. 5 is a perspective view illustrating a configuration of a deep ultraviolet LED using the p-type semiconductor layer of the present disclosure.

In Example 3, a deep ultraviolet LED was produced and evaluated. The produced deep ultraviolet LED is described with reference to FIG. 5. This deep ultraviolet LED included a buffer layer 202, an n-type semiconductor layer 203, a light emitting layer 204, an electron block layer 205, a p-type semiconductor layer 206, and a contact layer 207 on the substrate 201. An electrode 208 was formed on the n-type semiconductor layer 203, around the mesa formed of the light emitting layer 204, the electron block layer 205, the p-type semiconductor layer 206, and the contact layer 207. Further, a semi-transparent electrode layer 209 and an electrode 210 were formed on the contact layer 207.

The substrate 201 included semi-insulating 4H-SiC, and had 0001 as a surface orientation of the main surface. The buffer layer 202 included AlN, the n-type semiconductor layer 203 included a silicon-doped n-type AlN/AlGaN superlattice, the light emitting layer 204 included AlGaN multiple quantum wells, and the electron block layer 205 included AlN. The p-type semiconductor layer 206 was a p-type semiconductor layer 102 according to the embodiment described above, and included a plurality of unit semiconductor layers each including AlGaN and having a composition changing. Further, the contact layer 207 included a p-type GaN doped with Mg.

Semiconductor layers can be crystal grown sequentially on the substrate 201 by the MOVPE method. The light emitting layer 204, the electron block layer 205, the p-type semiconductor layer 206, and the contact layer 207 were patterned using known lithographic techniques and etching techniques to form a mesa, and the top surface of the n-type semiconductor layer 203 was exposed around this mesa. The electrodes 208 of Ti/Al/Ni/Au were formed on the top surface of the exposed n-type semiconductor layer 203 by well-known vapor deposition method and lift-off method. Further, a semi-transparent electrode layer 209 of Pd/Au was formed on the contact layer 207 formed in the mesa, and an electrode 210 including Au was formed on the semi-transparent electrode layer 209.

In Example 3, four types of LED samples described below were produced. An LED sample 1 was a p-type semiconductor layer 206 formed by stacking 20 layers of a unit semiconductor layer with a thickness of 10 nm. An LED sample 2 was a p-type semiconductor layer 206 formed by stacking 10 layers of a unit semiconductor layer with a thickness of 20 nm. An LED sample 3 was a p-type semiconductor layer 206 formed by stacking four layers of a unit semiconductor layer with a thickness of 50 nm. An LED sample 4 was a p-type semiconductor layer 206 formed by stacking two layers of a unit semiconductor layer with a thickness of 100 nm. In any LED sample, in one unit semiconductor layer, the Al composition x of $Al_xGa_{1-x}N$ was decreased from 0.9 to 0.7 relative to the crystal growth direction. In any LED sample, the doping amount of Mg was $2 \times 10^{19}$ $cm^{-3}$. After each LED sample was produced, the LED sample was heated at 800° C. for 10 minutes with $N_2$ flow using a lamp heating device to activate the LED sample.

As a comparative example, Comparative LED Sample 1 was produced by a p-type semiconductor layer 206 having a layer thickness of 200 nm including a Mg doped p-type $Al_xGa_{1-x}N$. In the Comparative LED Sample 1, the Al composition x of $Al_xGa_{1-x}N$ was decreased from 0.9 to 0.7 relative to the crystal growth direction of the p-type semiconductor layer 206. The Comparative LED Sample 1 was a sample in which the p-type semiconductor layer 206 included a single layer of the unit semiconductor layer having a thickness of 200 nm. Further, as a comparative example, Comparative LED Sample 2 was produced by a p-type semiconductor layer 206 having a layer thickness of 200 nm, including a p-type $Al_{0.8}Ga_{0.2}N$ doped with Mg. The Comparative LED Sample 2 has no change in composition in the thickness direction. In any comparative LED sample, the doping amount of Mg is $2\times10^{19}$ cm$^{-3}$. Further, after producing each comparative LED sample, the comparative LED sample was heated at 800° C. for 10 minutes with $N_2$ flow using a lamp heating device to activate the sample.

Figure 6:
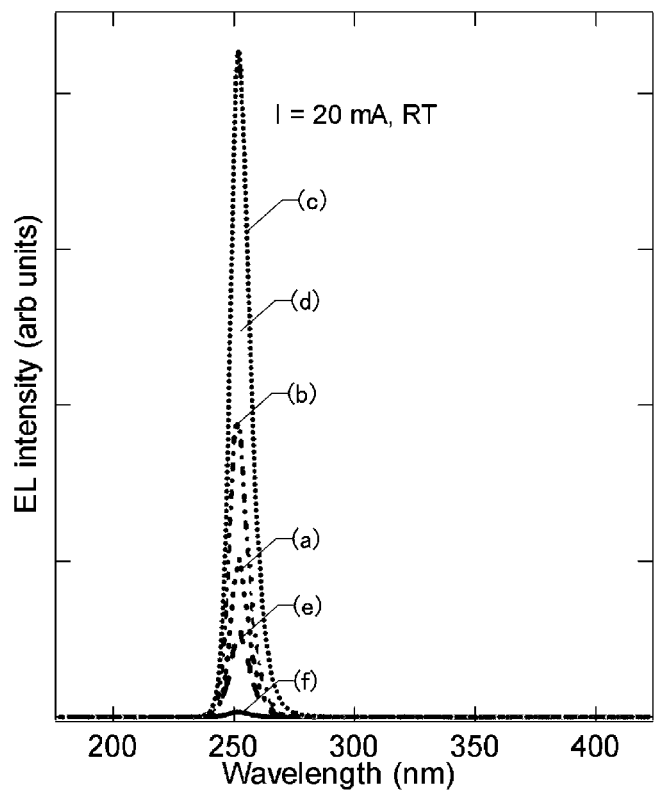
FIG. 6 is a characteristic diagram illustrating measurement results of an emission spectrum of each LED sample in Example 3.

The measurement results of the emission spectrum of each LED sample described above are illustrated in FIG. 6. In FIG. 6, (a) indicates the measurement result of the emission spectrum of the LED sample 1, (b) indicates the measurement result of the emission spectrum of the LED sample 2, (c) indicates the measurement result of the emission spectrum of the LED sample 3, and (d) indicates the measurement result of the emission spectrum of the LED sample 4. In FIG. 6, (e) indicates the measurement result of the emission spectrum of the Comparative LED Sample 1, and (f) illustrates the measurement result of the emission spectrum of the Comparative LED Sample 2.

The EL peak observed near the wavelength 252 nm illustrated in FIG. 6 is the light emission from the AlGaN multiple quantum well constituting the light emitting layer 204. As illustrated in the results of the LED samples 1 to 4 in FIG. 6, the p-type semiconductor layer 206 included the plurality of unit semiconductor layers, so that the emission intensity has increased with respect to the Comparative LED Samples 1 and 2.

Figure 7:
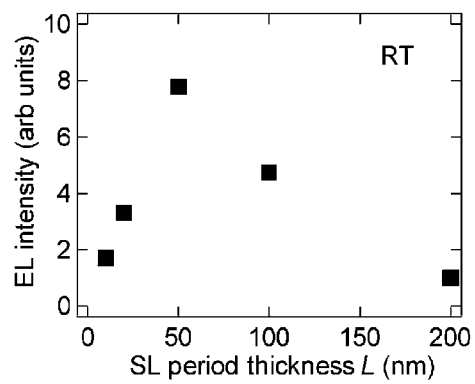
FIG. 7 is a characteristic diagram illustrating the layer thickness dependence of the unit semiconductor layer of the emission intensity of the deep ultraviolet LED of Example 3.

FIG. 7 illustrates the results of the layer thickness dependence of the unit semiconductor layer of the emission intensity of the deep ultraviolet LED of Example 3. The emission intensity increased as the layer thickness was reduced from 200 nm, and the maximum value was reached with a layer thickness of 50 nm (LED sample 3). The LED sample 3 with a layer thickness of the unit semiconductor layer 50 nm had approximately 8 times the emission intensity of the Comparative LED Sample 1. By configuring the p-type semiconductor layer 206 from the plurality of unit semiconductor layers and shortening the layer thickness of the unit semiconductor layer, a large number of negative polarization charges were induced, so that the hole concentration of the p-type semiconductor layer 206 increased. As a result, it is conceived that the hole injection efficiency from the p-type semiconductor layer 206 to the light emitting layer 204 increased, and the emission intensity increased.

On the other hand, when the layer thickness of the unit semiconductor layer was further reduced from 50 nm, the emission intensity tended to decrease. As a result, due to the thinning of the unit semiconductor layer, the number of potential barriers at the interface of adjacent unit semiconductor layers increased, so that it is conceived that the hole injection efficiency from the p-type semiconductor layer 206 to the light emitting layer 204 has decreased. From the above, it can be seen that both high hole concentration in the p-type semiconductor layer 206 and a reduction in the number of potential barriers at the interface of the unit semiconductor layers are necessary to increase the emission intensity.

As described above, in the present disclosure, the p-type semiconductor layer is configured by a plurality of unit semiconductor layers, each of the plurality of unit semiconductor layers is configured by a p-type nitride semiconductor of which main surface is a polar surface or a semi-polar surface, and each of the plurality of unit semiconductor layers has a composition changing in a stacking direction. As a result, according to the present disclosure, a low resistance p-type semiconductor layer having a high hole concentration of a nitride semiconductor can be provided.

According to the present disclosure, the hole injection efficiency of the LED or LD from the p-type semiconductor layer to the light emitting layer (active layer) is improved, and the emission intensity can be increased. For example, a p-type semiconductor layer including an unit semiconductor layer including $Al_xGa_{1-x}N$ having an Al composition of x>0.7 has a high hole concentration of $10^{17}$ cm$^{-3}$ or higher, so that it can be suitably used in a deep ultraviolet LED having a light emission wavelength of 300 nm or less or a deep ultraviolet LD.

The present disclosure is not limited to the embodiments described above, and it is obvious that many modifications and combinations can be implemented by a person having ordinary knowledge in the field within the technical spirit of the present disclosure.

REFERENCE SIGNS LIST

101 Substrate
102 P-type semiconductor layer
121 Unit semiconductor layer.

The invention claimed is:

1. A semiconductor apparatus, comprising:
   a substrate;
   a buffer layer on and in contact with the substrate;
   an n-type semiconductor layer on and in contact with the buffer layer;
   a light-emitting layer on and in contact with a first portion of the n-type semiconductor layer;
   a first electrode on and in contact with a second portion of the n-type semiconductor layer and at least partially surrounding the light-emitting layer;
   an electron block layer on and in contact with the light-emitting layer;
   a p-type semiconductor layer on and in contact with the electron block layer, wherein:
     the p-type semiconductor layer includes a plurality of unit semiconductor layers;
     each of the plurality of unit semiconductor layers includes a p-type nitride semiconductor whose main surface is a polar surface or a semi-polar surface;
     the p-type nitride semiconductor includes nitrogen and two or more elements; and
     each of the plurality of unit semiconductor layers has a composition changing in a stacking direction;
   a contact layer on and in contact with the p-type semiconductor layer;
   a semi-transparent layer on and in contact with the contact layer; and
   a second electrode on and in contact with a portion of the semi-transparent layer.

2. The semiconductor apparatus according to claim 1, wherein:
   each of the plurality of unit semiconductor layers changes such that a lattice constant in a c-axis direction increases in a c-axis positive direction.

3. The semiconductor apparatus according to claim 1, wherein:
   the composition of each of the plurality of unit semiconductor layers varies continuously.

4. The semiconductor apparatus according to claim 1, wherein each of the plurality of unit semiconductor layers are doped with p-type impurities.

5. The semiconductor apparatus according to claim 1, wherein the plurality of unit semiconductor layers includes AlGaN, and a composition ratio of Al to Ga changes in the stacking direction.

6. A method comprising:
forming a buffer layer on and in contact with a substrate;
forming an n-type semiconductor layer on and in contact with the buffer layer;
forming a light-emitting layer on and in contact with a first portion of the n-type semiconductor layer;
forming a first electrode on and in contact with a second portion of the n-type semiconductor layer and at least partially surrounding the light-emitting layer;
forming an electron block layer on and in contact with the light-emitting layer;
forming a p-type semiconductor layer on and in contact with the electron block layer, wherein:
  the p-type semiconductor layer includes a plurality of unit semiconductor layers;
  each of the plurality of unit semiconductor layers includes a p-type nitride semiconductor whose main surface is a polar surface or a semi-polar surface;
  the p-type nitride semiconductor includes nitrogen and two or more elements; and
  each of the plurality of unit semiconductor layers has a composition changing in a stacking direction;
forming a contact layer on and in contact with the p-type semiconductor layer;
forming a semi-transparent layer on and in contact with the contact layer; and
forming a second electrode on and in contact with a portion of the semi-transparent layer.

7. The method according to claim 6, wherein:
each of the plurality of unit semiconductor layers changes such that a lattice constant in a c-axis direction increases in a c-axis positive direction.

8. The method according to claim 6, wherein:
the composition of each of the plurality of unit semiconductor layers varies continuously.

9. The method according to claim 6 further comprising converting each of the plurality of unit semiconductor layers into p-type by doping with p-type impurities.

10. The method according to claim 6, wherein the plurality of unit semiconductor layers includes AlGaN, and a composition ratio of Al to Ga changes in the stacking direction.

* * * * *